United States Patent
Eriksson

(10) Patent No.: US 8,488,636 B2
(45) Date of Patent: Jul. 16, 2013

(54) METHOD FOR SUPPRESSING SIDE MODES IN A TUNABLE LASER

(75) Inventor: Urban Eriksson, Snäckvägen (SE)

(73) Assignee: Syntune AB, Kista (SE)

( * ) Notice: Subject to any disclaimer, the term of this patent is extended or adjusted under 35 U.S.C. 154(b) by 303 days.

(21) Appl. No.: 12/933,105

(22) PCT Filed: Mar. 20, 2009

(86) PCT No.: PCT/SE2009/050296
§ 371 (c)(1),
(2), (4) Date: Dec. 1, 2010

(87) PCT Pub. No.: WO2009/116947
PCT Pub. Date: Sep. 24, 2009

(65) Prior Publication Data
US 2011/0069726 A1   Mar. 24, 2011

(30) Foreign Application Priority Data
Mar. 20, 2008   (SE) ...................... 0800656

(51) Int. Cl.
*H01S 3/098* (2006.01)

(52) U.S. Cl.
USPC ...................... 372/18; 372/50.1; 372/50.11

(58) Field of Classification Search
USPC .................... 372/18, 50.1, 50.11
See application file for complete search history.

(56) References Cited

U.S. PATENT DOCUMENTS

| 6,658,033 B1 * | 12/2003 | Andersson ................. 372/38.02 |
| 2002/0018504 A1 * | 2/2002 | Coldren ........................ 372/50 |
| 2004/0125833 A1 * | 7/2004 | Sarlet et al. ..................... 372/20 |
| 2006/0072631 A1 * | 4/2006 | Farrell et al. ................... 372/20 |

FOREIGN PATENT DOCUMENTS

| WO | 00/49692 A1 | 8/2000 |
| WO | 03/077382 A2 | 9/2003 |
| WO | 01/03262 A1 | 1/2010 |

OTHER PUBLICATIONS

International Search Report, dated Jun. 25, 2009, from corresponding PCT application.
R. LaRoy et al., "Stabilisation and control of widely tunable MG-Y lasers with integrated photodetectors", IET Optoelectronics, Feb. 2007, pp. 35-38, vol. 1, Issue 1.

* cited by examiner

*Primary Examiner* — Yuanda Zhang
(74) *Attorney, Agent, or Firm* — Young & Thompson

(57) ABSTRACT

Method for suppressing side modes during use of a tunable laser of MGY type, having an amplification section, a phase section and a reflector section having a Y-branched waveguide, with a first a second branch, where the laser operation point is defined by feeding a respective current through the phase section, the first and the second branch, where possible combinations of these currents span a three-dimensional space, in which elongated volumes define combinations of currents for which the laser is operated in the same mode and where two-dimensional sections, defined by holding the current through the phase section constant and varying the currents through the branches, through a certain of the volumes constitute modeflats. The two branch currents are controlled within a certain modeflat so that the laser operation point does not coincide with the center of the modeflat, but is sufficiently far from the periphery of the modeflat for mode transitions not to occur, within a predetermined time period, as a consequence of changes related to ageing of the laser, leading to drift of the laser operation point.

7 Claims, 6 Drawing Sheets

METHOD FOR SUPPRESSING SIDE MODES IN A TUNABLE LASER

The present invention relates to a method for suppressing side modes during the operation of a tunable semiconductor laser of MGY (Modulated Grating Y-branch) type.

Such a laser comprises at least the following sections: a reflector section, a phase section and an amplification section. The reflector section is divided into two branches. The operation properties of the laser are controlled by adjusting tuning currents through the phase section and through both the respective reflector branches. In this way, operation properties such as wavelength, power and mode purity may be controlled.

Mode purity means that the laser is to be in a point of operation, that is a combination of the three tuning currents, which is characterized in that the point of operation is located at a distance from a combination of tuning currents at which so called mode transitions take place, where the lasing is more stable and where the suppression of so called side modes is powerful. In general, high mode purity and powerful side mode suppression is desirable.

For the control of the wavelength there are special demands for different applications. For example, for sensor applications the laser is to be continuously tunable, so that mode transitions are avoided as much as possible. For applications within telecommunications, a demand is that the laser, after setting the tuning currents and the temperature, should keep its useful life with very high precision concerning the wavelength for a very long time. A typical precision is 0.1 nm and a typical timespan is 20 years.

As the laser ages, its properties change so that the points of operation at which mode transitions take place move. Thus, a point of operation for the laser is chosen so that it is located at a great enough distance from neighbouring points of operation at which mode transitions take place.

However, it has turned out to be difficult for each wavelength to choose points of operation for tunable lasers, which also display powerful side mode suppression.

The present invention solves this problem.

Thus, the present invention relates to a method for suppressing side modes during the use of a tunable laser of MGY type, which laser comprises an amplification section, a phase section and a reflector section, which reflector section comprises a Y-branched waveguide, with a first branch and a second branch, where the point of operation of the laser is defined by way of feeding a respective current through the phase section, the first branch and the second branch, where possible combinations of these currents span a three-dimensional space, in which elongated volumes define combinations of currents for which the laser is operated in the same mode and where two-dimensional sections, defined by holding the current through the phase section constant and varying the currents through the branches, through a certain of said volumes constitute modeflats, and is characterised in that the two branch currents are controlled within a certain modeflat so that the point of operation of the laser does not coincide with the centre of the modeflat, but is sufficiently far from the periphery of the modeflat for mode transitions not to occur, within a predetermined time period, as a consequence of changes related to ageing of the laser, leading to drift of the point of operation of the laser.

In the following, the invention will be described in closer detail, with reference to exemplifying embodiments of methods according to the invention for suppressing side modes during the operation of a tunable semiconductor laser.

Figure 1:
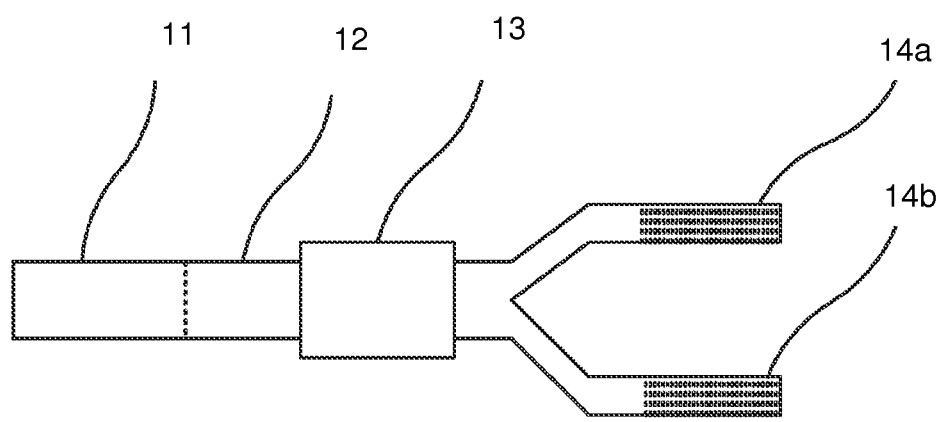
FIG. 1 shows schematically a sketch of an MGY laser.

FIG. 1 schematically illustrates an MGY laser 10 of a type that may be used when carrying out the method of the present invention. The laser comprises an amplification section 11, a phase section 12, a coupler 13 as well as two reflector branches 14a, 14b.

Figure 2:
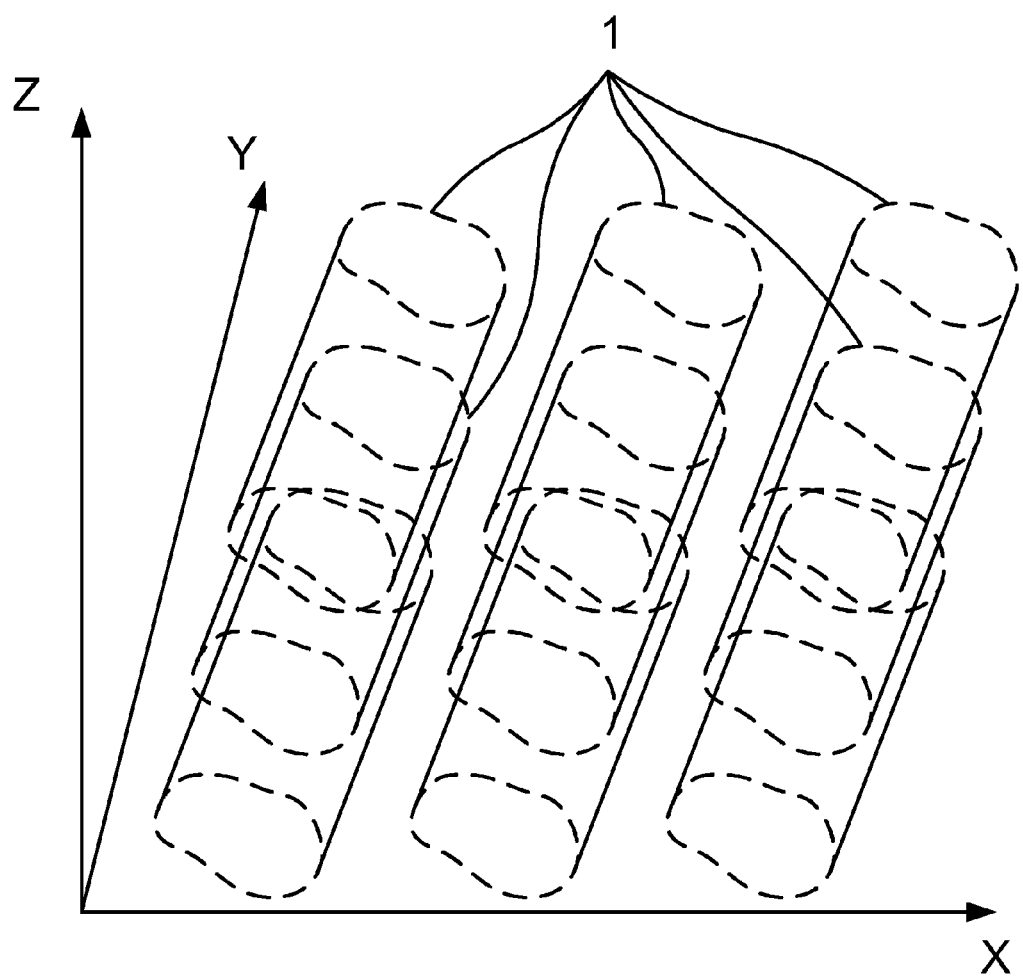
FIG. 2 is a three-dimensional diagram, showing mode volumes for a tunable semiconductor laser.

FIG. 2 shows a three-dimensional diagram, in which the three axes represent the respective tuning currents through the first reflector branch (X), the second reflector branch (Y) and the phase section (Z), which tuning currents are used to control the operating properties of a tunable semiconductor laser of MGY type. As is made clear from the diagram, there are a number of areas 1, which in an essentially cylindrical manner extend in the three-dimensional space. The centre lines of the regions 1 generally extend obliquely along the Z-direction.

Each region 1, in the following denoted mode volume, corresponds to a collection of points in the three-dimensional space of possible points of operation for the laser, for which the laser is operated with the same mode.

Figure 3:
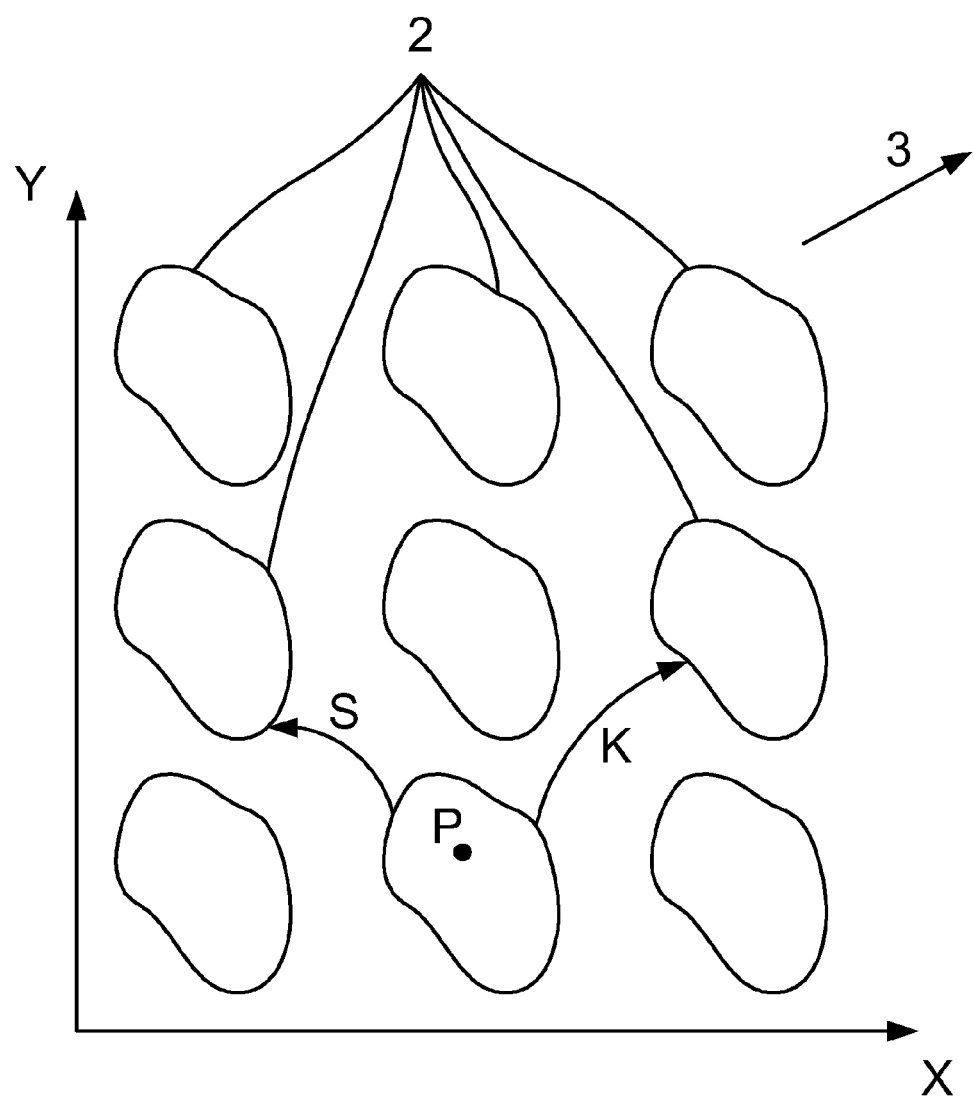
FIG. 3 is a two-dimensional diagram, showing modeflats for a tunable semiconductor laser.

FIG. 3 shows sections in the XY plane of the diagram according to FIG. 2. As is more clearly illustrated in FIG. 3, the mode volumes 1 form separated surfaces 2 when the tuning current through the phase section (Z-axis) is kept constant. When the current through the phase section is altered, corresponding to a translation in the Z direction in the diagram according to FIG. 2, the surfaces 2 will change form and/or position, but they will continue to be separated. In the following, the surfaces 2 are denoted modeflats.

When the laser is operated in a point which is located within a mode volume, and in case the point of operation is changed to another point within the same mode volume, the operation properties of the laser will be changed in accordance with the change of the tuning currents, but it will still be operated with the same mode. When the point of operation is chosen to be a point closer to the edge of a modeflat, the laser will, however, approach a mode transition, and will hop to another mode when at the edge of the modeflat. Such a mode transition may either take place between two so called reflector peaks or wihtin the same reflector peak, in the latter case between modes with adjacent mode index. The first type of mode transition is also called supermode hop, and occurs when the tuning current through one of the reflector branches increases at the same time as the tuning current through the other one decreases. The second type of mode transition is also called cavity mode hop, and occurs when both the tuning currents through the respective reflector branches either is increased or decreased simultaneously. One example of a supermode hop S is illustrated in FIG. 3, along with an example of a cavity mode hop K.

As the laser ages, its operation properties are changed so that the diagram shown in FIG. 3 is translated in a certain direction 3. The direction 3 and the velocity for this translation varies across different lasers and conditions, but in general results in that a certain point of operation P, chosen at a certain point in time to be in a certain modeflat for a certain phase section tuning current, and which is not translated along with the shown modeflats, over time will change its position within the modeflat. After a sufficiently long time, the point of operation will reach one of the edges of the modeflat, whereupon a mode transition will occur. Such a mode transition is not desirable, since it puts the predictability over time during operation of the laser at risk.

Therefore, in order to maximise the useful life of the laser, it is today sought to operate the laser at points of operation located as far as possible from the closest mode transition. In this way, the distance in the XY plane is maximised for the translation occurring as a consequence of the ageing, of the laser before the translation results in a mode transition.

However, also other operation properties of the laser vary across different points of operation in the same mode volume and in the same modeflat. Specifically, the side mode suppression varies across such points of operation.

Figure 4:
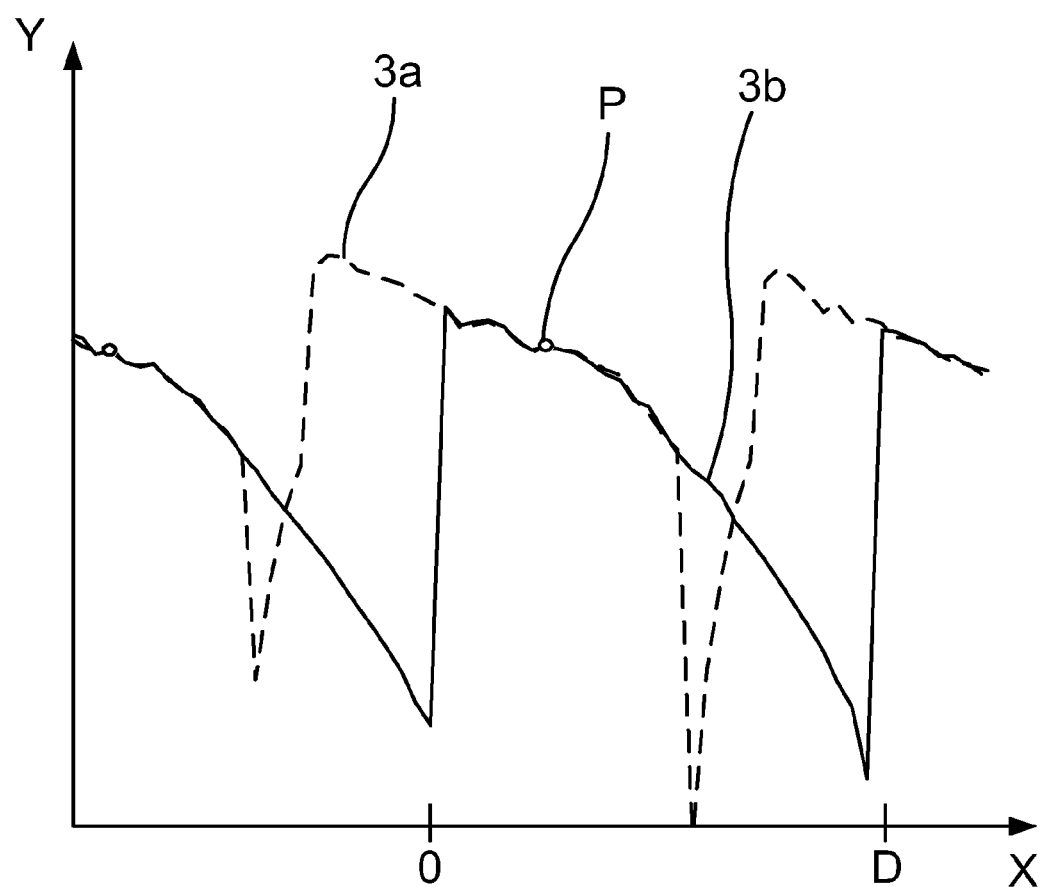
FIG. 4 is a graph, showing the change in side mode suppression for different points of operation along a line within one and the same modeflat for a tunable semiconductor laser.
Figure 5:
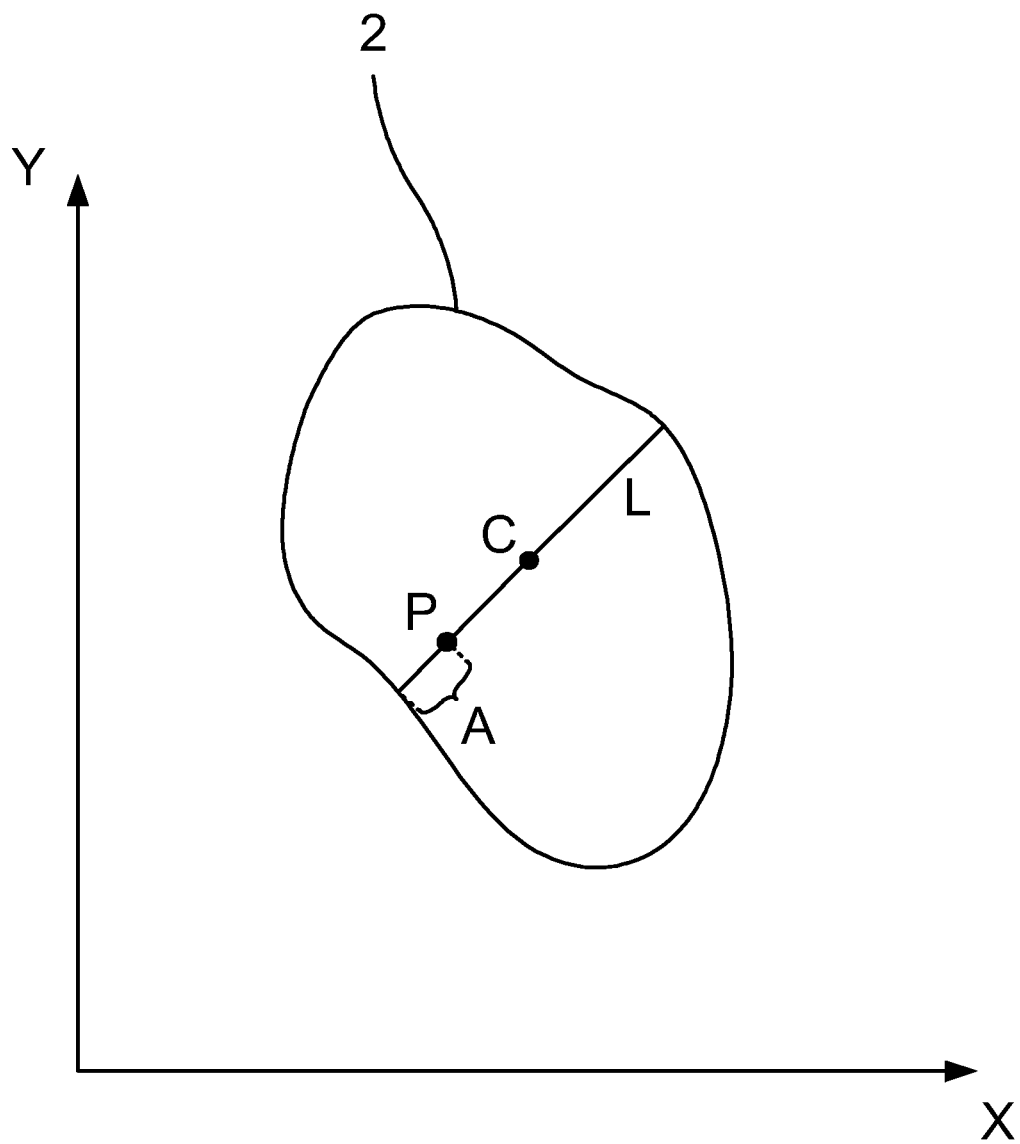
FIG. 5 is a graph, illustrating the choice of point of operation according to the present invention for a tunable semiconductor laser.

It has surprisingly been found that the side mode suppression within a certain modeflat is not maximal in the centre of the modeflat, but follows a graph which is essentially illustrated in FIG. 4. In FIG. 4, a graph 3*a* shows, in unbroken lines, the side mode suppression (Y-axis), expressed in dB, as a function of the distance (X-axis), with increasing tuning currents through both the respective reflector branches, from one edge of a modeflat (X=0), where the distance varies across the one edge and over to the other one (X=D), along a straight line L, running through the centre of the modeflat. The line L of the graph is illustrated in FIG. 5, in which the centre of the modeflat C is also marked out.

Moreover, in FIG. 4, a graph 3*b* shows, in broken lines, the sidemode suppression, expressed in dB, as a function of the distance, but as the modeflat is traversed in a direction opposite to the one of the graph 3*a*. As is made clear by FIG. 4, the graphs 3*a* and 3*b* are not identical, and are somewhat translated in the X-direction in relation to each other. In other words, there is a certain hysteresis regarding the resulting sidemode suppression depending on the direction from which one approaches the final point of operation. According to a preferred embodiment, the point of operation is set from one direction, so that that resulting sidemode operation becomes as large as possible. In the following, it is assumed that this is the case when choosing points of operation, even if this is not explicit from the description.

In certain cases, there are also areas in a certain mode where there is essentially no hysteresis. In these cases, it is preferred to set the point of operation so that it falls within such an area free from hysteresis, when so does not contravene other principles as described herein.

As is illustrated in FIG. 4, the sidemode suppression as a function of the distance from one of the edges of the modeflat has a derivative which is generally negative. For a given modeflat, this means that the lower the tuning currents through the respective reflector branches, the larger the sidemode suppression. It has turned out that the derivative is essentially negative for all lines intersecting the centre C of the modeflat, as long as the tuning currents through both the respective reflector branches increase along the line.

Thus, the problem which arises is that for a certain given tuning current through the phase section to find a point of operation in which the sidemode suppression is as large as possible and where a certain smallest margin against age-induced translation at the same time is maintained. According to the present invention, this point of operation is chosen by adjusting the two branch currents within a certain modeflat so that the point of operation does not coincide with the centre of the modeflat, but so that it is sufficiently far from the periphery of the modeflat in order for mode transitions not to occur within a predetermined time period as a consequence of changes of the laser due to ageing. Preferably, the predetermined time is at least 20 years.

In FIG. 4, a possible point of operation P is illustrated, completely by way of example.

In order to achieve the above indicated purposes, the distance A, between one of the edges of the modeflat and the chosen point of operation P, is according to the present invention selected to be between 20% and 40% of the length of the line L. According to yet another preferred embodiment, the distance A is selected to be about 25% of the length of the line L.

Since the sidemode suppression according to the above said decreases with increasing tuning currents across the respective reflector branches, the line L is chosen so that it runs from the first edge with growing values for both the respective tuning currents, and the point of operation P is thereby selected so that both the tuning currents are smaller than their corresponding values in the centre C of the modeflat.

According to an especially preferred embodiment of the present invention, the line L is chosen so that the change of the both respective tuning currents through the reflector branches is equal in relation to the centre C of the modeflat for all points along the line L. In other words, the point of operation P is chosen so that it is located at a certain distance from the centre C of the modeflat in a direction of 45° downwards and to the left, in the third quadrant in relation to the centre C of the modeflat, in the diagram according to FIG. 5.

By choosing the point of operation P for the laser according to the above described guidelines, it is possible, for tunable MGY lasers and given a certain modeflat, to achieve a point of operation for which the sidemode suppression exceeds 40 dB at the same time as the desired margin regarding age-induced mode transitions is maintained, which is preferred.

The wavelength of a semiconductor laser of MGY type may be controlled by adjusting the tuning current through the phase section. According to what has been said above, during such an adjustment, the modeflat within which the point of operation falls may be altered. According to the present invention, the wavelength of the laser is thus controlled by first adjusting the tuning current through the phase section so that a desired wavelength is achieved for the laser, whereafter the point of operation in the selected modeflat is selected according to the above described principles. Also, it may be the case that the wavelength of the laser is altered during the process for selecting the point of operation in a certain modeflat, why an iterative method, in which the tuning currents through the phase section as well as through the reflector branches is adjusted in several consequtive steps, may be applied.

By allowing continuous adjustment of the tuning currents through the phase section in this way, a continuous control of the wavelength of the laser across its spectrum is achieved.

Figure 6:
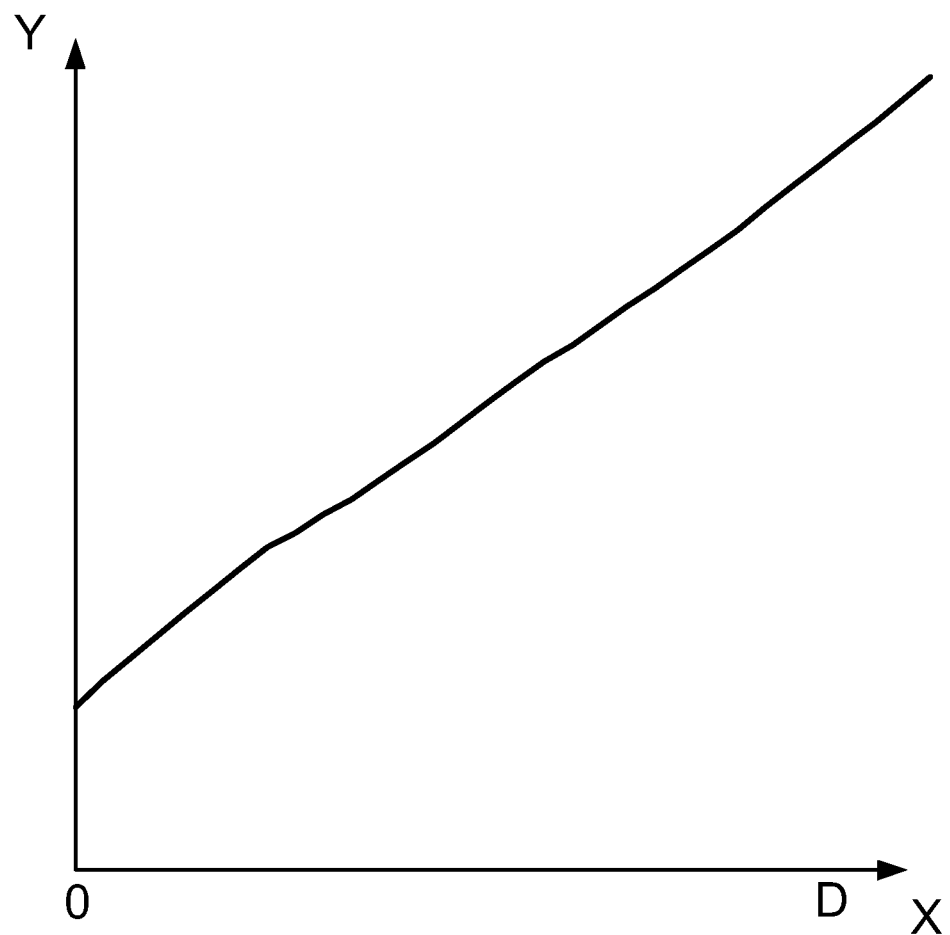
FIG. 6 is a graph, showing the change in wavelength as a function of modeflat for a tunable semiconductor laser.

FIG. 6 illustrates schematically the resulting frequency (Y-axis) for a typical tunable semiconductor laser of MGY type as a function of the tuning current through the phase section (X-axis). A translation between two points on the function curve according to FIG. 6 thus corresponds to a translation of the point of operation within the same mode volume.

Depending on the other properties of the laser, operating conditions, purposes of the application, etc., various principles may be used when doing the exact selection of the point of operation in each given modeflat, as the tuning current through the phase section is adjusted across a continuous collection of modeflats in the same mode volume.

According to a preferred embodiment, the point of operation is selected for each respective modeflat so that it is located at the same relative distance from the periphery of the respective modeflat, as measured from the centre of the respective modeflat. In other words, the relative distance A, as a percentage, for each modeflat is selected to be the same.

According to another preferred embodiment, the point of operation for each respective modeflat is selected so that the distance between the periphery of the modeflat and the point of operation is such that the predetermined time is the same for each respective modeflat. In other words, the point of operation in each respective modeflat is selected so that the expected shortest useful life for the laser at each wavelength is the same. In this case, the resulting sidemode suppression may vary across different modeflats.

According to a similar, preferred embodiment, the point of operation is selected for each respective modeflat not so that the expected shortest useful life is the same for all wavelengths, but so that the sidemode suppression is the same for all wavelengths. In this case, the resulting expected shortest useful life may thus vary across different modeflats.

It is realised that many other principles for selecting points of operation in different modeflats for the same laser may be useful, depending on the other properties of the current laser, etc.

Above, preferred embodiments have been described. However, it is apparent for the skilled person that many modifications may be made to the described embodiments without departing from the idea of the invention. Thus, the invention will not be limited to the described embodiments, but rather be variable within the frame of the enclosed claims.

The invention claimed is:

1. A method for suppressing side modes during the use of a tunable laser (10) of MGY type, which laser (10) comprises an amplification section (11), a phase section (12) and a reflector section, which reflector section comprises a Y-branched waveguide, with a first branch (14a) and a second branch (14b), the method comprising:
    defining a point of operation of the laser (10) by feeding a respective current through the phase section (12), the first branch (14a) and the second branch (14b), where possible combinations of these currents span a three-dimensional space, in which elongated volumes (1) define combinations of currents for which the laser (10) is operated in the same mode; and
    defining two-dimensional sectional surfaces through a certain of said volumes (1) by holding the current through the phase section (12) constant and varying the current through the branches (14a;14b), wherein the two branch currents (14a;14b) are chosen within a certain surface (2) so that the point of operation (P) of the laser (10) is caused to be positioned along a line (L), which line (L) runs from the periphery of the surface (2) at a first side of the surface (2), through both the center (C) of the surface (2) and the point of operation (P), and to the periphery of the surface (2) at the opposite side of the surface (2), at a distance (A) from the periphery of the surface (2) which is within an interval of between 20% and 40% of the length of the line (L),
    wherein the point of operation (P) is selected so that both respective branch currents are smaller than at the center (C) of the surface (2).

2. The method according to claim 1, wherein the distance (A) is caused to be 25% of the length of the line (L).

3. The method according to claim 1, wherein the point of operation (P) is positioned along a line (L) obtained by equally decreasing the respective branch currents in relation to the center (C) of the surface (2).

4. The method according to claim 1, wherein the point of operation (P) is selected so that the sidemode suppression at the selected point of operation (P) exceeds 40 dB.

5. The method according to claim 1, wherein the frequency of the laser (10) is controlled by adjusting the current through the phase section (12) which results in a change of surface (2), and the control of the two respective branch currents (14a; 14b) thereafter are adjusted in the new surface (2).

6. The method according to claim 5, wherein the point of operation (P) for each respective surface (2) is caused to lie at the same relative distance (A) from the periphery of the respective surface (2), as measured from the center (C) of the respective surface (2).

7. The method according to claim 5, wherein the distance (A) between the periphery of each respective surface (2) and the selected point of operation (P) for the respective surface (2) is caused to be such that the side mode suppression is the same for each respective surface (2).

* * * * *

UNITED STATES PATENT AND TRADEMARK OFFICE
CERTIFICATE OF CORRECTION

PATENT NO.       : 8,488,636 B2
APPLICATION NO.  : 12/933105
DATED            : July 16, 2013
INVENTOR(S)      : Urban Eriksson Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 376 days.

Signed and Sealed this
Eighth Day of September, 2015

Michelle K. Lee
*Director of the United States Patent and Trademark Office*